United States Patent
Lee et al.

(10) Patent No.: US 9,916,885 B2
(45) Date of Patent: Mar. 13, 2018

(54) SEMICONDUCTOR DEVICES HAVING A REFRESH OPERATION

(71) Applicant: SK hynix Inc., Icheon-si, Gyeonggi-do (KR)

(72) Inventors: Dong Uk Lee, Seoul (KR); Dae Suk Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/427,572

(22) Filed: Feb. 8, 2017

(65) Prior Publication Data

US 2018/0025772 A1 Jan. 25, 2018

(30) Foreign Application Priority Data

Jul. 25, 2016 (KR) ..................... 10 2016 009 4270

(51) Int. Cl.
| | |
|---|---|
| *G11C 8/10* | (2006.01) |
| *G11C 11/406* | (2006.01) |
| *G11C 11/4093* | (2006.01) |
| *G11C 11/4091* | (2006.01) |
| *G11C 11/4076* | (2006.01) |
| *G11C 11/408* | (2006.01) |

(52) U.S. Cl.
CPC .......... *G11C 11/40618* (2013.01); *G11C 8/10* (2013.01); *G11C 11/4076* (2013.01); *G11C 11/4085* (2013.01); *G11C 11/4091* (2013.01); *G11C 11/4093* (2013.01)

(58) Field of Classification Search
CPC ................. G11C 11/406; G11C 8/10
USPC ............................................. 365/222, 230.06
See application file for complete search history.

(56) References Cited

U.S. PATENT DOCUMENTS

| | | | | |
|---|---|---|---|---|
| 5,404,338 A * | 4/1995 | Murai | ................... | G11C 7/1072 365/189.05 |
| 5,831,924 A * | 11/1998 | Nitta | ......................... | G11C 8/14 365/189.17 |
| 9,318,185 B2 * | 4/2016 | Kim | ................... | G11C 11/40615 |
| 2002/0001246 A1 * | 1/2002 | Hidaka | ................... | G11C 11/406 365/222 |
| 2002/0008705 A1 * | 1/2002 | Yamagishi | ............... | G09G 5/39 345/519 |
| 2002/0054530 A1 * | 5/2002 | Chung | ................... | G11C 11/406 365/222 |
| 2002/0080677 A1 * | 6/2002 | Watanabe | ................ | G11C 8/12 365/189.011 |

(Continued)

FOREIGN PATENT DOCUMENTS

KR 1020120098055 A 9/2012

*Primary Examiner* — Michael Tran
(74) *Attorney, Agent, or Firm* — William Park & Associates Ltd.

(57) ABSTRACT

A semiconductor device includes a first row address generation circuit and a second row address generation circuit. The first row address generation circuit generates a first row address for refreshing memory cells connected to word lines included in a first up block and a second up block from a refresh command and an active signal in response to a period selection signal and a first period signal. The second row address generation circuit generates a second row address for refreshing memory cells connected to word lines included in a first down block and a second down block from the refresh command and the active signal in response to the period selection signal and a second period signal.

27 Claims, 16 Drawing Sheets

(56) References Cited

U.S. PATENT DOCUMENTS

| | | | |
|---|---|---|---|
| 2003/0135699 A1* | 7/2003 | Matsuzaki | G06F 13/1605 711/149 |
| 2005/0068840 A1* | 3/2005 | Park | G11C 8/12 365/232 |
| 2005/0105362 A1* | 5/2005 | Choi | G11C 11/406 365/222 |
| 2007/0121410 A1* | 5/2007 | Mori | G11C 11/406 365/222 |
| 2007/0230264 A1 | 10/2007 | Eto | |
| 2008/0212386 A1* | 9/2008 | Riho | G11C 5/025 365/222 |
| 2010/0182862 A1* | 7/2010 | Teramoto | G11C 7/04 365/222 |
| 2013/0254475 A1* | 9/2013 | Perego | G11C 11/40603 711/106 |
| 2013/0308405 A1* | 11/2013 | Jeong | G11C 7/00 365/222 |
| 2014/0016422 A1* | 1/2014 | Kim | G11C 11/402 365/222 |
| 2014/0355332 A1* | 12/2014 | Youn | G11C 11/40615 365/149 |
| 2015/0036445 A1* | 2/2015 | Yoshida | G11C 11/40626 365/222 |
| 2015/0199234 A1* | 7/2015 | Choi | G11C 29/42 714/764 |
| 2015/0243345 A1* | 8/2015 | Kim | G11C 11/4082 365/189.05 |
| 2016/0005452 A1* | 1/2016 | Bae | G11C 29/24 714/764 |
| 2016/0027492 A1* | 1/2016 | Byun | G11C 11/406 365/222 |
| 2016/0224272 A1* | 8/2016 | Kim | G06F 3/0647 |

\* cited by examiner

SEMICONDUCTOR DEVICES HAVING A REFRESH OPERATION

CROSS-REFERENCE TO RELATED APPLICATIONS

The present application claims priority under 35 U.S.C 119(a) to Korean Application No. 10-2016-0094270, filed on Jul. 25, 2016, which is incorporated herein by reference in its entirety as though fully set forth herein.

BACKGROUND

1. Technical Field

The present invention relates generally to semiconductor devices and in particular to a semiconductor device performing a refresh operation.

2. Related Art

Semiconductor devices may be typically categorized as either volatile memory devices or nonvolatile memory devices. The volatile memory devices lose their stored data when their power supplies are interrupted. In contrast, the nonvolatile memory devices retain their stored data even when their power supplies are interrupted. The volatile memory devices may include dynamic random access memory (DRAM) devices and static random access memory (SRAM) devices.

Each of the DRAM devices may include a cell array portion that stores digital information including a plurality of bits. The cell array portion of each DRAM device may include a plurality of cells, and each of the cells may include a single cell transistor and a single cell capacitor. Data of the digital information may be stored in the cell capacitors. The DRAM devices may lose their stored data as the time elapses even though their power voltages are supplied. This may be due to leakage currents of the cell capacitors. Thus, the cell capacitors of the DRAM devices have to be periodically recharged to retain or refresh their stored data. This operation may be referred to as a refresh operation.

SUMMARY

As the DRAM devices become more highly integrated, the cell array portion of each DRAM device may be divided into a plurality of banks. Each of the banks may be activated by a bank active signal to execute a refresh operation.

According to an embodiment, a semiconductor device includes a first row address generation circuit and a second row address generation circuit. The first row address generation circuit generates a first row address for refreshing memory cells connected to word lines included in a first up block and a second up block from a refresh command and an active signal in response to a period selection signal and a first period signal. The second row address generation circuit generates a second row address for refreshing memory cells connected to word lines included in a first down block and a second down block from the refresh command and the active signal in response to the period selection signal and a second period signal.

According to another embodiment, a semiconductor device includes a row address generation circuit generating a row address for refreshing memory cells connected to word lines included in a first block and a second block from a refresh command and an active signal in response to a period selection signal and a period signal.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, embodiments in accordance with the present invention will be explained in more detail with reference to the accompanying drawings. Although the present invention is described with reference to a number of example embodiments thereof, it should be understood that numerous other modifications and variations may be devised by one skilled in the art that will fall within the spirit and scope of the invention.

Figure 1:
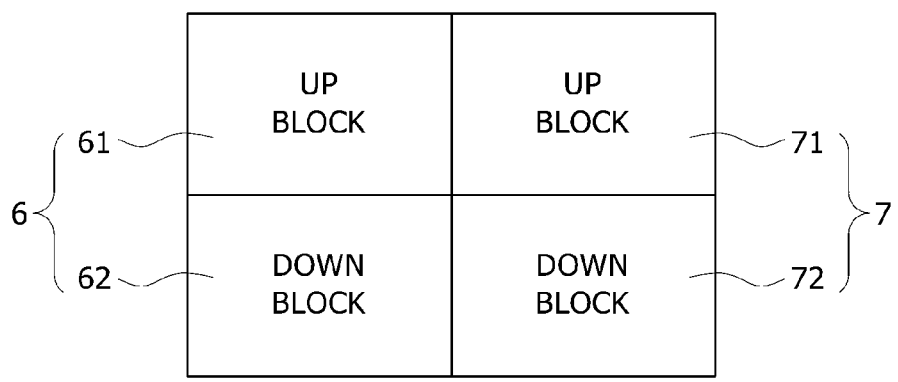
FIG. 1 is a block diagram illustrating a core region in which a refresh operation is performed.

As illustrated in FIG. 1, a core region of a semiconductor device in an embodiment in accordance with the present invention may include a first bank 6 and a second bank 7.

The first bank 6 may include a first up block 61 and a first down block 62. The second bank 7 may include a second up block 71 and a second down block 72. The first up block 61 and the second up block 71 may be simultaneously refreshed by the same address. The first down block 62 and the second down block 72 may be simultaneously refreshed by the same address. Each of the first up block 61, the first down block 62, the second up block 71 and the second down block 72 may include a plurality of word lines, and a plurality of memory cells may be connected to each word line. For example, each of the first up block 61, the first down block 62, the second up block 71 and the second down block 72 may include "8K"—number of word lines, and a plurality of memory cells may be connected to each word line and may be refreshed. In the previous sentence, the character "K" means a number corresponding to $2^{10}$. The number of the word lines included in each of the first up block 61, the first down block 62, the second up block 71 and the second down block 72 may be set to be different according to the embodiments.

Figure 2:
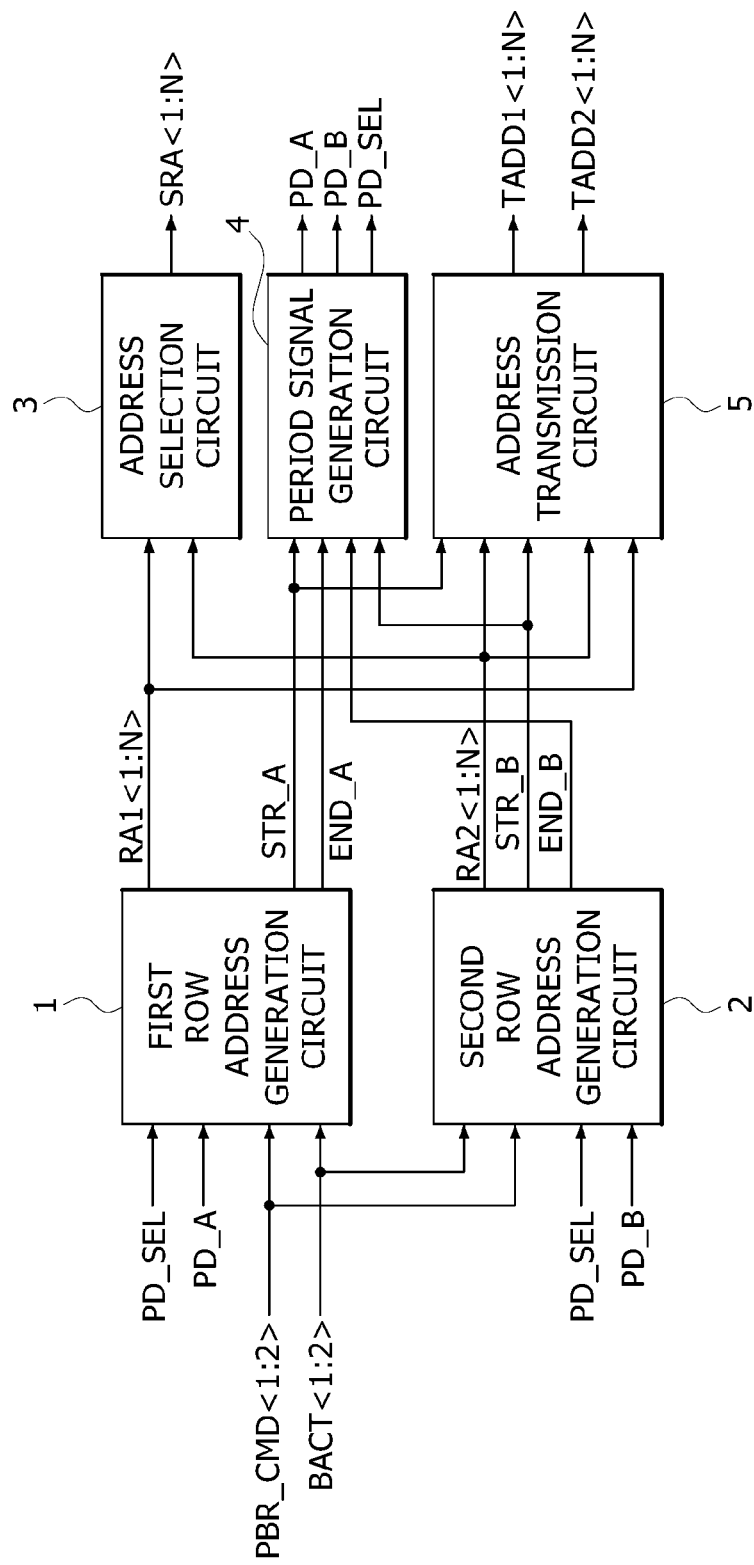
FIG. 2 is a block diagram illustrating a configuration of a semiconductor device in an embodiment in accordance with the present invention.

As illustrated in FIG. 2, a semiconductor device according to an embodiment may include a first row address generation circuit 1, a second row address generation circuit 2, an address selection circuit 3, a period signal generation circuit 4 and an address transmission circuit 5.

The first row address generation circuit 1 may generate a first row address RA1<1:N>, a first start signal STR_A and a first end signal END_A in response to a period selection signal PD_SEL, a first period signal PD_A, a refresh commands PBR_CMD<1:2> and a bank active signals BACT<1:2>. The period selection signal PD_SEL may be set to have a first logic level to refresh the first up block (61 of FIG. 1) and the second up block (71 of FIG. 1) using the refresh commands PBR_CMD<1:2> and may be set to have a second logic level to refresh the first down block (62 of FIG. 1) and the second down block (72 of FIG. 1) using the refresh commands PBR_CMD<1:2>. In the present embodiment, the first logic level and the second logic level may be set to be a logic "low" level and a logic "high" level, respectively. However, in some other embodiments, the first logic level and the second logic level may be set to be a logic "high" level and a logic "low" level, respectively. The first period signal PD_A may be enabled to refresh the first up block 61 and the second up block 71 using the bank active signals BACT<1:2>. A logic level of the first period signal PD_A, which is enabled, may be set to be different according to the embodiments. The first up block 61 and the second up block 71 may be refreshed by the first row address RA1<1:N>. The first and second up blocks 61 and 71 may include a predetermined number of word lines, and a plurality of memory cells are connected to each word line. The first row address RA1<1:N> may be sequentially counted to activate all of the word lines included in the first and second up blocks 61 and 71 in order, and the memory cells connected to the activated word line may be refreshed. Logic level combinations of the first row address RA1<1:N> corresponding to the respective word lines included in the first and second up blocks 61 and 71 may be set to be different according to the embodiments. The first start signal STR_A may be enabled if the first row address RA1<1:N> has a logic level combination corresponding to the last one among the word lines included in the first and second up blocks 61 and 71. The first end signal END_A may be enabled if the first row address RA1<1:N> has a logic level combination corresponding to the second last one among the word lines included in the first and second up blocks 61 and 71. For example, if the first and second up blocks 61 and 71 include "8K"—number of word lines, the memory cells connected to the first word line disposed in the first and second up blocks 61 and 71 may be refreshed firstly, the memory cells connected to the second word line disposed in the first and second up blocks 61 and 71 may be refreshed secondly, and the memory cells connected to the $8K^{th}$ word line disposed in the first and second up blocks 61 and 71 may be refreshed finally. In such a case, the first start signal STR_A may be enabled if the first row address RA1<1:N> has a logic level combination corresponding to the $8K^{th}$ word line among the word lines disposed in the first and second up blocks 61 and 71, and the first end signal END_A may be enabled if the first row address RA1<1:N> has a logic level combination corresponding to the $(8K-1)^{th}$ word line among the word lines included in the first and second up blocks 61 and 71. The word line, which is disposed in the first and second up blocks 61 and 71, corresponding to a logic level combination of the first row address RA1<1:N> for enabling the first end signal END_A may be set to be different according to the embodiments. After the memory cells connected to the last word line (i.e., the $8K^{th}$ word line) among the word lines disposed in the first and second up blocks 61 and 71 are refreshed by the first row address RA1<1:N> having a logic level combination corresponding to the last word line (i.e., the $8K^{th}$ word line), the first row address RA1<1:N> may be counted to have a logic level combination corresponding to the first word line of the first and second up blocks 61 and 71. A configuration and an operation of the first row address generation circuit 1 will be described more fully with reference to FIGS. 3 to 9.

The second row address generation circuit 2 may generate a second row address RA2<1:N>, a second start signal STR_B and a second end signal END_B in response to the period selection signal PD_SEL, a second period signal PD_B, the refresh commands PBR_CMD<1:2> and the bank active signals BACT<1:2>. The second period signal PD_B may be enabled to refresh the first down block 62 and the second down block 72 using the bank active signals BACT<1:2>. A logic level of the second period signal PD_B, which is enabled, may be set to be different according to the embodiments. The first down block 62 and the second down block 72 may be refreshed by the second row address RA2<1:N>. The first and second down blocks 62 and 72 may include a predetermined number of word lines, and a plurality of memory cells are connected to each word line. The second row address RA2<1:N> may be sequentially counted to activate all of the word lines included in the first and second down blocks 62 and 72 in order, and the memory cells connected to the activated word line may be refreshed. Logic level combinations of the second row address RA2<1:N> corresponding to the respective word lines included in the first and second down blocks 62 and 72 may be set to be different according to the embodiments. The second start signal STR_B may be enabled if the second row address RA2<1:N> has a logic level combination corresponding to the last one among the word lines included in the first and second down blocks 62 and 72. The second end signal END_B may be enabled if the second row address RA2<1:N> has a logic level combination corresponding to the second last one among the word lines included in the first and second down blocks 62 and 72. For example, if the first and second down blocks 62 and 72 include "8K"-number of word lines, the memory cells connected to the first word line disposed in the first and second down blocks 62 and 72 may be refreshed firstly, the memory cells connected to the second word line disposed in the first and second down blocks 62 and 72 may be refreshed secondly, and the memory cells connected to the 8K$^{th}$ word line disposed in the first and second down blocks 62 and 72 may be refreshed finally. In such a case, the second start signal STR_B may be enabled if the second row address RA2<1:N> has a logic level combination corresponding to the 8K$^{th}$ word line among the word lines disposed in the first and second down blocks 62 and 72, and the second end signal END_B may be enabled if the second row address RA2<1:N> has a logic level combination corresponding to the (8K−1)$^{th}$ word line among the word lines included in the first and second down blocks 62 and 72. The word line, which is disposed in the first and second down blocks 62 and 72, corresponding to a logic level combination of the second row address RA2<1:N> for enabling the second end signal END_B may be set to be different according to the embodiments. After the memory cells connected to the last word line (i.e., the 8K$^{th}$ word line) among the word lines disposed in the first and second down blocks 62 and 72 are refreshed by the second row address RA2<1:N> having a logic level combination corresponding to the last word line (i.e., the 8K$^{th}$ word line), the second row address RA2<1:N> may be counted to have a logic level combination corresponding to the first word line of the first and second down blocks 62 and 72.

The address selection circuit 3 may generate a refresh address SRA<1:N> in response to the first row address RA1<1:N> and the second row address RA2<1:N>. The address selection circuit 3 may selectively output the first row address RA1<1:N> as the refresh address SRA<1:N> to simultaneously refresh the first and second up blocks 61 and 71. The address selection circuit 3 may selectively output the second row address RA2<1:N> as the refresh address SRA<1:N> to simultaneously refresh the first and second down blocks 62 and 72. A configuration and an operation of the address selection circuit 3 will be described more fully with reference to FIGS. 10 to 12.

The period signal generation circuit 4 may generate the first period signal PD_A, the second period signal PD_B and the period selection signal PD_SEL in response to the first start signal STR_A, the first end signal END_A, the second start signal STR_B and the second end signal END_B. The period signal generation circuit 4 may generate the first period signal PD_A which is enabled from a point of time that the first start signal STR_A is enabled until a point of time that the first end signal END_A is enabled. The first start signal STR_A may be enabled if the first row address RA1<1:N> has a logic level combination corresponding to the last word line of the first and second up blocks 61 and 71. The first end signal END_A may be enabled if the first row address RA1<1:N> has a logic level combination corresponding to the second last word line of the first and second up blocks 61 and 71. The first period signal PD_A may be enabled to refresh the first and second up blocks 61 and 71 using the bank active signals BACT<1:2>. The period signal generation circuit 4 may generate the second period signal PD_B which is enabled from a point of time that the second start signal STR_B is enabled until a point of time that the second end signal END_B is enabled. The second start signal STR_B may be enabled if the second row address RA2<1:N> has a logic level combination corresponding to the last word line of the first and second down blocks 62 and 72. The second end signal END_B may be enabled if the second row address RA2<1:N> has a logic level combination corresponding to the second last word line of the first and second down blocks 62 and 72. The second period signal PD_B may be enabled to refresh the first and second down blocks 62 and 72 using the bank active signals BACT<1:2>. The period signal generation circuit 4 may generate the period selection signal PD_SEL having the first logic level (i.e., a logic "low" level in the present embodiment) in synchronization with a point of time that the second start signal STR_B is enabled and having the second logic level (i.e., a logic "high" level in the present embodiment) in synchronization with a point of time that the first start signal STR_A is enabled. The period selection signal PD_SEL may be set to have the second logic level to refresh the first and second up blocks 61 and 71 using the refresh commands PBR_CMD<1:2> and may be set to have the first logic level to refresh the first and second down blocks 62 and 72 using the refresh commands PBR_CMD<1:2>. A configuration and an operation of the period signal generation circuit 4 will be described more fully with reference to FIG. 13.

The address transmission circuit 5 may output the first row address RA1<1:N> and the second row address RA2<1:N> as a first transmission address TADD1<1:N> and a second transmission address TADD2<1:N> in response to the first and second start signals STR_A and STR_B. The address transmission circuit 5 may output the first row address RA1<1:N> as the first transmission address TADD1<1:N> in synchronization with a point of time that the second start signal STR_B is enabled. The address transmission circuit 5 may output the second row address RA2<1:N> as the second transmission address TADD2<1:N> in synchronization with a point of time that the first start signal STR_A is enabled. The first row address RA1<1:N> may be outputted as the first transmission address TADD1<1:N> if a refresh operation of the memory cells connected to the first word line included in the first and second down blocks 62 and 72 is performed. The first transmission address TADD1<1:N> may be transmitted to a memory controller (not shown) that controls an operation of the semiconductor device. A logic level combination of the first row address RA1<1:N> may indicate whether a refresh operation of the memory cells connected to the word lines of the first and second up blocks 61 and 71 is performed or not. The memory controller (not shown) may apply the refresh commands PBR_CMD<1:2> to the semiconductor device based on the first transmission address TADD1<1:N> to control execution of a refresh operation of the memory cells connected to the last word line of the first and second up blocks 61 and 71, during a period that the memory cells connected to the word lines of the first and second down blocks 62 and 72 are refreshed by the bank active signals BACT<1:2>. The second row address RA2<1:N> may be outputted as the second transmission address TADD2<1:N> if a refresh operation of the memory cells connected to the first word line included in the first and second up blocks 61 and 71 is performed. The second transmission address TADD2<1:N> may be transmitted to the memory controller (not shown) that controls an operation of the semiconductor device. A logic level combination of the second row address RA2<1:N> may indicate whether a refresh operation of the memory cells connected to the word lines of the first and second down blocks 62 and 72 is performed or not. The memory controller (not shown) may apply the refresh commands PBR_CMD<1:2> to the semiconductor device based on the second transmission address TADD2<1:N> to control execution of a refresh operation of the memory cells connected to the last word line of the first and second down blocks 62 and 72, during a period that the memory cells connected to the word lines of the first and second up blocks 61 and 71 are refreshed by the bank active signals BACT<1:

2>. A configuration and an operation of the address transmission circuit 5 will be described more fully with reference to FIG. 14.

Figure 3:
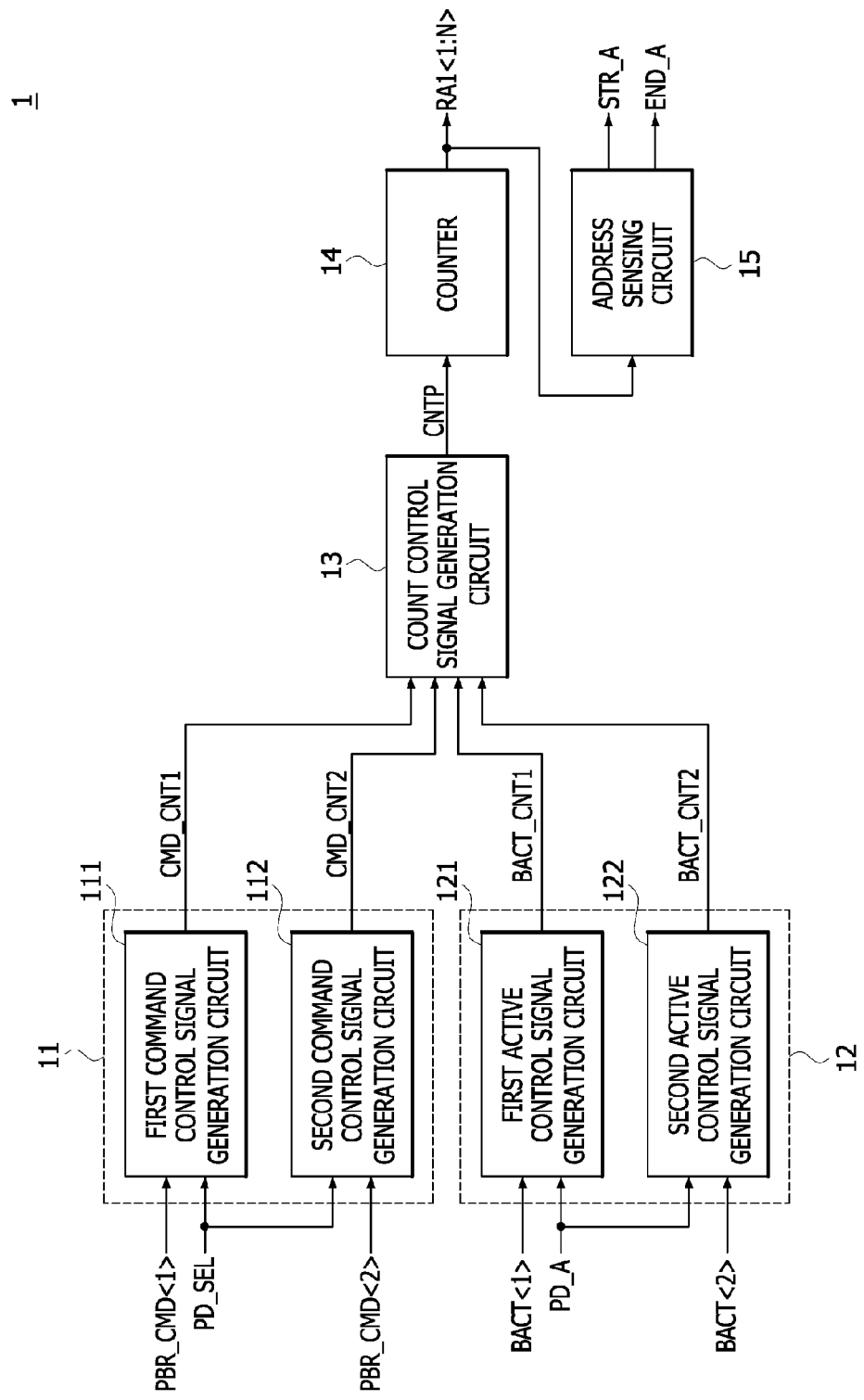
FIG. 3 is a block diagram illustrating an example of a first row address generation circuit included in the semiconductor device of FIG. 2.

Referring to FIG. 3, the first row address generation circuit 1 may include a command control signal generation circuit 11, an active control signal generation circuit 12, a count control signal generation circuit 13, a counter 14 and an address sensing circuit 15. The command control signal generation circuit 11 may include a first command control signal generation circuit 111 and a second command control signal generation circuit 112. The active control signal generation circuit 12 may include a first active control signal generation circuit 121 and a second active control signal generation circuit 122.

The first command control signal generation circuit 111 may generate a first command control signal CMD_CNT1 in response to the period selection signal PD_SEL and the refresh command PBR_CMD<1>. The first command control signal generation circuit 111 may generate the first command control signal CMD_CNT1 which is enabled if the refresh command PBR_CMD<1> is enabled while the period selection signal PD_SEL has the first logic level (i.e., a logic "low" level in the present embodiment). The refresh command PBR_CMD<1> may be enabled for a refresh operation of the memory cells connected to the word lines of the first up block 61 in the first bank 6. A configuration and an operation of the first command control signal generation circuit 111 will be described more fully with reference to FIG. 4.

The second command control signal generation circuit 112 may generate a second command control signal CMD_CNT2 in response to the period selection signal PD_SEL and the refresh command PBR_CMD<2>. The second command control signal generation circuit 112 may generate the second command control signal CMD_CNT2 which is enabled if the refresh command PBR_CMD<2> is enabled while the period selection signal PD_SEL has the first logic level (i.e., a logic "low" level in the present embodiment). The refresh command PBR_CMD<2> may be enabled for a refresh operation of the memory cells connected to the word lines of the second up block 71 in the second bank 7. A configuration and an operation of the second command control signal generation circuit 112 will be described more fully with reference to FIG. 5.

The first active control signal generation circuit 121 may generate a first active control signal BACT_CNT1 in response to the first period signal PD_A and the bank active signal BACT<1>. The first active control signal generation circuit 121 may generate the first active control signal BACT_CNT1 which is enabled if the bank active signal BACT<1> is enabled while the first period signal PD_A is enabled. The bank active signal BACT<1> may be enabled to activate the word lines of the first up block 61 in the first bank 6 for execution of an active operation of the first up block 61. The first active control signal generation circuit 121 may block the input of the bank active signal BACT<1> to prevent unnecessary power consumption which is due to the enabled bank active signal BACT<1>, if the first active control signal BACT_CNT1 is enabled. A configuration and an operation of the first active control signal generation circuit 121 will be described more fully with reference to FIG. 6.

The second active control signal generation circuit 122 may generate a second active control signal BACT_CNT2 in response to the first period signal PD_A and the bank active signal BACT<2>. The second active control signal generation circuit 122 may generate the second active control signal BACT_CNT2 which is enabled if the bank active signal BACT<2> is enabled while the first period signal PD_A is enabled. The bank active signal BACT<2> may be enabled to activate the word lines of the second up block 71 in the second bank 7 for execution of an active operation of the second up block 71. The second active control signal generation circuit 122 may block the input of the bank active signal BACT<2> to prevent unnecessary power consumption which is due to the enabled bank active signal BACT<2>, if the second active control signal BACT_CNT2 is enabled. A configuration and an operation of the second active control signal generation circuit 122 will be described more fully with reference to FIG. 7.

The count control signal generation circuit 13 may generate a count control signal CNTP in response to the first command control signal CMD_CNT1, the second command control signal CMD_CNT2, the first active control signal BACT_CNT1 and the second active control signal BACT_CNT2. The count control signal generation circuit 13 may generate the count control signal CNTP which is enabled if both of the first and second command control signals CMD_CNT1 and CMD_CNT2 are enabled. The count control signal generation circuit 13 may generate the count control signal CNTP which is enabled if a refresh operation of the memory cells connected to the word lines of the first and second up blocks 61 and 71 terminates by the refresh commands PBR_CMD<1:2>. The count control signal generation circuit 13 may generate the count control signal CNTP which is enabled if both of the first and second active control signals BACT_CNT1 and BACT_CNT2 are enabled. The count control signal generation circuit 13 may generate the count control signal CNTP which is enabled if a refresh operation of the memory cells connected to the word lines of the first and second up blocks 61 and 71 terminates by the bank active signals BACT<1:2>.

The counter 14 may output the first row address RA1<1:N> that is counted in response to the count control signal CNTP. The counter 14 may output the first row address RA1<1:N> that is sequentially counted if the count control signal CNTP is enabled. For example, if the number "N" of the first row address RA1<1:N> is three, the first row address RA1<1:N> may be counted up whenever the count control signal CNTP is enabled so that the counter 14 sequentially outputs the first row addresses of '000', '001', '010', '011', '100', '101', '110' and '111'. If the first row address RA1<1:N> having a combination of '111' is counted once, the first row address RA1<1:N> may be circulated to have a combination of '000'.

The address sensing circuit 15 may sense a logic level combination of the first row address RA1<1:N> to generate the first start signal STR_A and the first end signal END_A. The address sensing circuit 15 may generate the first start signal STR_A which is enabled if a logic level combination of the first row address RA1<1:N> corresponds to the last word line of the first up block 61. For example, if the number "N" of the first row address RA1<1:N> is three, the address sensing circuit 15 may generate the first start signal STR_A which is enabled when the first row address RA1<1:N> has a logic level combination of '111'. The address sensing circuit 15 may generate the first end signal END_A which is enabled if a logic level combination of the first row address RA1<1:N> corresponds to the second last word line of the first up block 61. For example, if the number "N" of the first row address RA1<1:N> is three, the address sensing circuit 15 may generate the first end signal END_A which is enabled when the first row address RA1<1:N> has a logic level combination of '110'.

Figure 4:
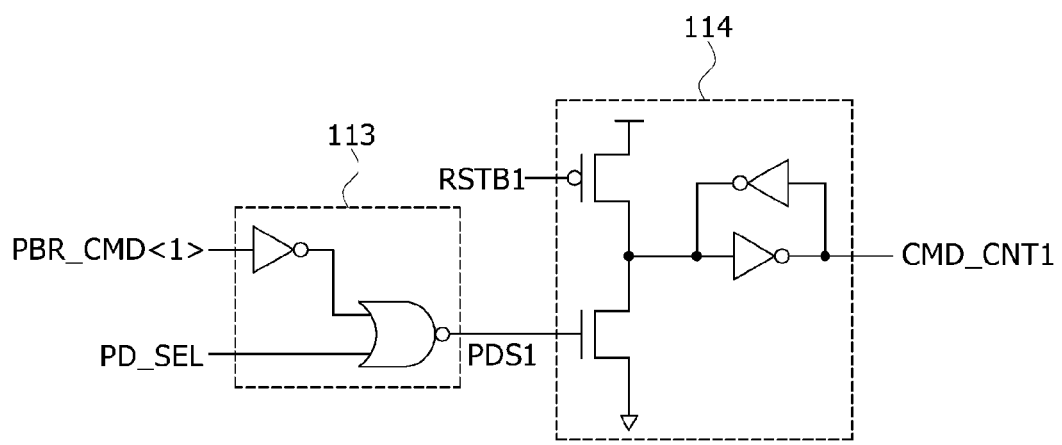
FIG. 4 is a circuit diagram illustrating an example of a first command control signal generation circuit included in the first row address generation circuit of FIG. 3.

Referring to FIG. 4, the first command control signal generation circuit 111 may include a pull-down signal generation circuit 113 and a command control signal driving circuit 114.

The pull-down signal generation circuit 113 may generate a first pull-down signal PDS1 in response to the period selection signal PD_SEL and the refresh command PBR_CMD<1>. The pull-down signal generation circuit 113 may generate the first pull-down signal PDS1 which is enabled to have a logic "high" level if the refresh command PBR_CMD<1> is enabled to have a logic "high" level while the period selection signal PD_SEL has a logic "low" level.

The command control signal driving circuit 114 may generate the first command control signal CMD_CNT1 in response to a first reset signal RSTB1 and the first pull-down signal PDS1. The command control signal driving circuit 114 may drive the first command control signal CMD_CNT1 to have a logic "low" level if the first reset signal RSTB1 is enabled to have a logic "low" level. The first reset signal RSTB1 may be enabled to have a logic "low" if both of the first and second command control signals CMD_CNT1 and CMD_CNT2 are enabled to have a logic "high" level. The command control signal driving circuit 114 may drive the first command control signal CMD_CNT1 to have a logic "high" level if the first pull-down signal PDS1 is enabled to have a logic "high" level.

Figure 5:
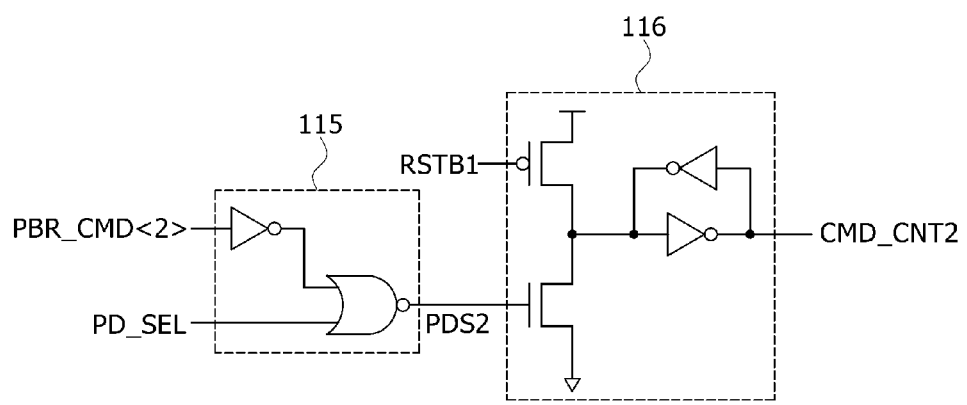
FIG. 5 is a circuit diagram illustrating an example of a second command control signal generation circuit included in the first row address generation circuit of FIG. 3.

Referring to FIG. 5, the second command control signal generation circuit 112 may include a pull-down signal generation circuit 115 and a command control signal driving circuit 116.

The pull-down signal generation circuit 115 may generate a second pull-down signal PDS2 in response to the period selection signal PD_SEL and the refresh command PBR_CMD<2>. The pull-down signal generation circuit 115 may generate the second pull-down signal PDS2 which is enabled to have a logic "high" level if the refresh command PBR_CMD<2> is enabled to have a logic "high" level while the period selection signal PD_SEL has a logic "low" level.

The command control signal driving circuit 116 may generate the second command control signal CMD_CNT2 in response to the first reset signal RSTB1 and the second pull-down signal PDS2. The command control signal driving circuit 116 may drive the second command control signal CMD_CNT2 to have a logic "low" level if the first reset signal RSTB1 is enabled to have a logic "low" level. The command control signal driving circuit 116 may drive the second command control signal CMD_CNT2 to have a logic "high" level if the second pull-down signal PDS2 is enabled to have a logic "high" level.

Figure 6:
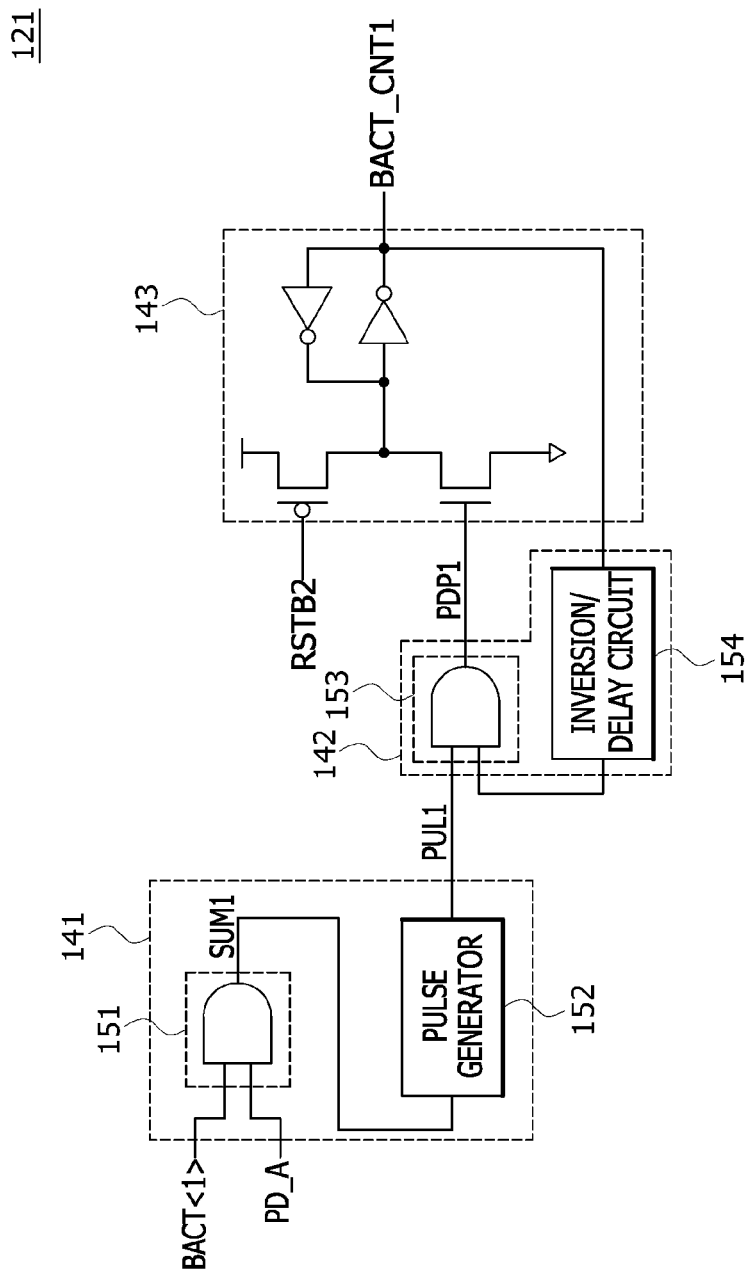
FIG. 6 is a circuit diagram illustrating an example of a first active control signal generation circuit included in the first row address generation circuit of FIG. 3.

Referring to FIG. 6, the first active control signal generation circuit 121 may include a pulse generation circuit 141, a pull-down pulse generation circuit 142 and a bank active control signal driving circuit 143.

The pulse generation circuit 141 may include a signal synthesizer 151 and a pulse generator 152. The signal synthesizer 151 may generate a first synthesis signal SUM1 in response to the first period signal PD_A and the bank active signal BACT<1>. The signal synthesizer 151 may generate the first synthesis signal SUM1 which is enabled to have a logic "high" level if both of the first period signal PD_A and the bank active signal BACT<1> are enabled to have a logic "high" level. The pulse generator 152 may generate a first pulse PUL1 in response to the first synthesis signal SUM1. The pulse generator 152 may generate the first pulse PUL1 which is created if the first synthesis signal SUM1 is enabled.

The pull-down pulse generation circuit 142 may include a logic circuit 153 and an inversion/delay circuit 154. The logic circuit 153 may generate a first pull-down pulse PDP1 in response to the first pulse PUL1 and an output signal of the inversion/delay circuit 154. The logic circuit 153 may buffer the first pulse PUL1 to output the buffered signal as the first pull-down pulse PDP1 while the output signal of the inversion/delay circuit 154 has a logic "high" level. The inversion/delay circuit 154 may invert and delay the first active control signal BACT_CNT1 and may output the inverted and delayed signal of the first active control signal BACT_CNT1 as its output signal.

The bank active control signal driving circuit 143 may generate the first active control signal BACT_CNT1 in response to a second reset signal RSTB2 and the first pull-down pulse PDP1. The bank active control signal driving circuit 143 may drive the first active control signal BACT_CNT1 to have a logic "low" level if the second reset signal RSTB2 is enabled to have a logic "low" level. The bank active control signal driving circuit 143 may drive the first active control signal BACT_CNT1 to have a logic "high" level if the first pull-down pulse PDP1 is generated to have a logic "high" level.

Figure 7:
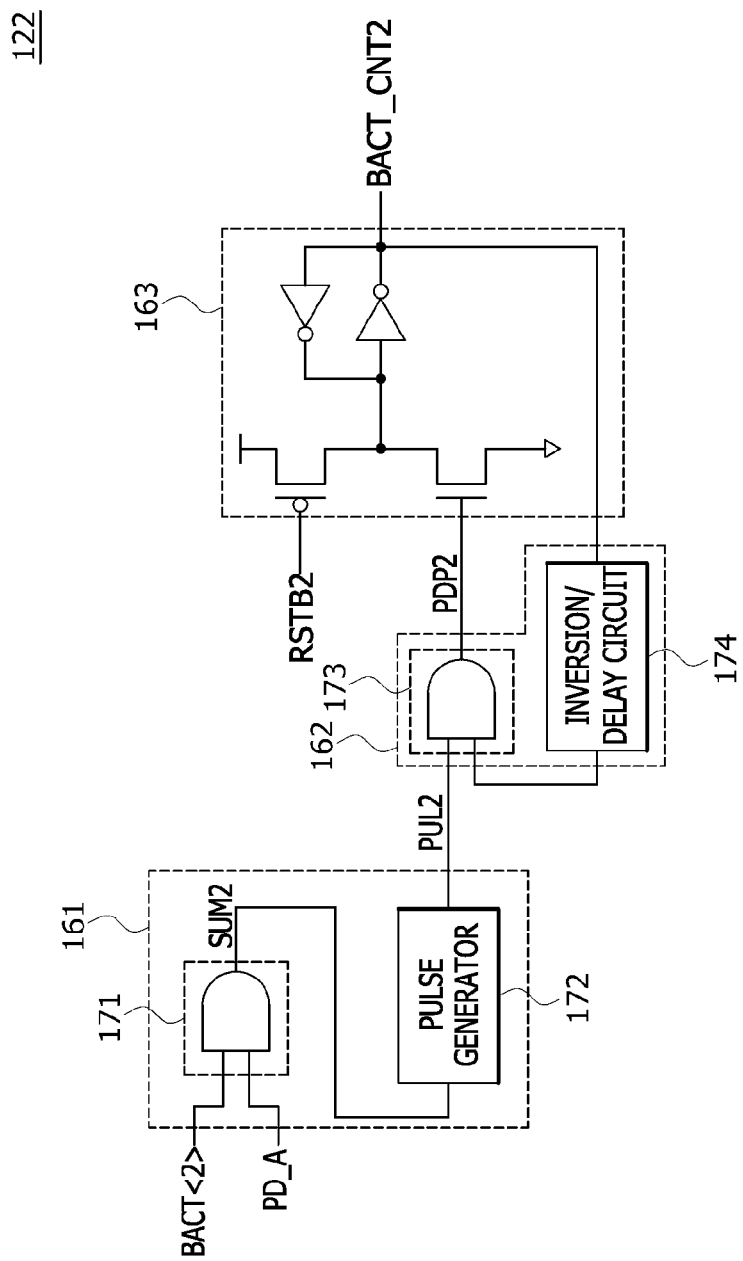
FIG. 7 is a circuit diagram illustrating an example of a second active control signal generation circuit included in the first row address generation circuit of FIG. 3.

Referring to FIG. 7, the second active control signal generation circuit 122 may include a pulse generation circuit 161, a pull-down pulse generation circuit 162 and a bank active control signal driving circuit 163.

The pulse generation circuit 161 may include a signal synthesizer 171 and a pulse generator 172. The signal synthesizer 171 may generate a second synthesis signal SUM2 in response to the first period signal PD_A and the bank active signal BACT<2>. The signal synthesizer 171 may generate the second synthesis signal SUM2 which is enabled to have a logic "high" level if both of the first period signal PD_A and the bank active signal BACT<2> are enabled to have a logic "high" level. The pulse generator 172 may generate a second pulse PUL2 in response to the second synthesis signal SUM2. The pulse generator 172 may generate the second pulse PUL2 which is created if the second synthesis signal SUM2 is enabled.

The pull-down pulse generation circuit 162 may include a logic circuit 173 and an inversion/delay circuit 174. The logic circuit 173 may generate a second pull-down pulse PDP2 in response to the second pulse PUL2 and an output signal of the inversion/delay circuit 174. The logic circuit 173 may buffer the second pulse PUL2 to output the buffered signal as the second pull-down pulse PDP2 while the output signal of the inversion/delay circuit 174 has a logic "high" level. The inversion/delay circuit 174 may invert and delay the second active control signal BACT_CNT2 and may output the inverted and delayed signal of the second active control signal BACT_CNT2 as its output signal.

The bank active control signal driving circuit 163 may generate the second active control signal BACT_CNT2 in response to the second reset signal RSTB2 and the second pull-down pulse PDP2. The bank active control signal driving circuit 163 may drive the second active control signal BACT_CNT2 to have a logic "low" level if the second reset signal RSTB2 is enabled to have a logic "low" level. The bank active control signal driving circuit 163 may drive the second active control signal BACT_CNT2 to have a logic "high" level if the second pull-down pulse PDP2 is generated to have a logic "high" level.

Figure 8:
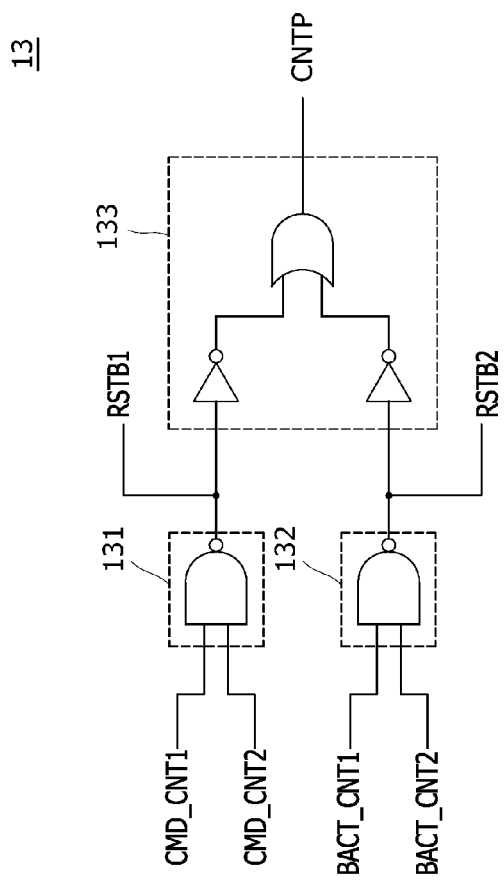
FIG. 8 is a circuit diagram illustrating an example of a count control signal generation circuit included in the first row address generation circuit of FIG. 3.

Referring to FIG. 8, the count control signal generation circuit 13 may include a first reset signal generator 131, a second reset signal generator 132 and a control signal output circuit 133. The first reset signal generator 131 may generate the first reset signal RSTB1 in response to the first command control signal CMD_CNT1 and the second command control signal CMD_CNT2. The first reset signal generator 131 may generate the first reset signal RSTB1 which is enabled to have a logic "low" level if both of the first command control signal CMD_CNT1 and the second command control signal CMD_CNT2 are enabled to have a logic "high" level. The second reset signal generator 132 may generate the second reset signal RSTB2 in response to the first active control signal BACT_CNT1 and the second active control signal BACT_CNT2. The second reset signal generator 132 may generate the second reset signal RSTB2 which is enabled to have a logic "low" level if both of the first active control signal BACT_CNT1 and the second active control signal BACT_CNT2 are enabled to have a logic "high" level. The control signal output circuit 133 may generate the count control signal CNTP in response to the first reset signal RSTB1 and the second reset signal RSTB2. The control signal output circuit 133 may generate the count control signal CNTP which is enabled to have a logic "high" level if at least one of the first reset signal RSTB1 and the second reset signal RSTB2 is enabled to have a logic "low" level.

Figure 9:
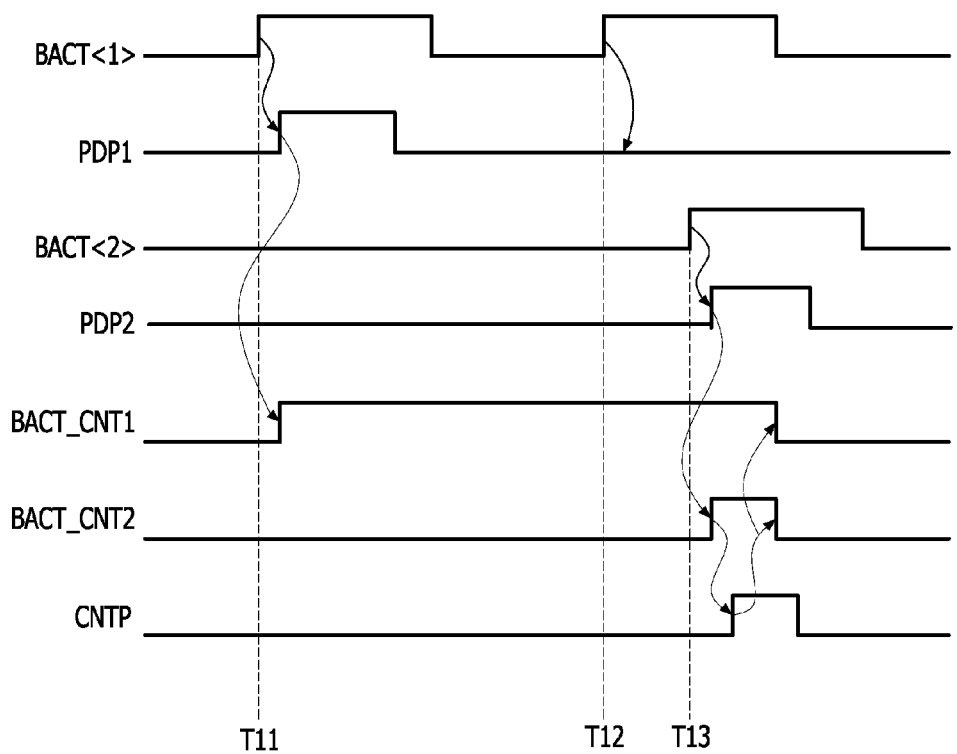
FIG. 9 is a timing diagram illustrating an operation of the first row address generation circuit shown in FIGS. 3 to 8.

Referring to FIG. 9, an operation that the first and second up blocks 61 and 71 are refreshed by the bank active signals BACT<1:2> may be confirmed. At a point of time "T11", if the bank active signal BACT<1> is enabled to have a logic "high" level, the first pull-down pulse PDP1 may be created to enable the first active control signal BACT_CNT1 to have a logic "high" level. While the first active control signal BACT_CNT1 is enabled to have a logic "high" level, the word lines of the first up block 61 may be activated by the first row address RA1<1:N> to refresh the memory cells connected to the activated word lines of the first up block 61. While the first active control signal BACT_CNT1 is enabled to have a logic "high" level, additional input of the bank active signal BACT<1> enabled to have a logic "high" level may be blocked. That is, even though the bank active signal BACT<1> enabled to have a logic "high" level is inputted at a point of time "T12", the first pull-down pulse PDP1 is not created to reduce power consumption. If the bank active signal BACT<2> is enabled to have a logic "high" level at a point of time "T13", the second pull-down pulse PDP2 may be created to enable the second active control signal BACT_CNT2 to have a logic "high" level. While the second active control signal BACT_CNT2 is enabled to have a logic "high" level, the word lines of the second up block 71 may be activated by the first row address RA1<1:N> to refresh the memory cells connected to the activated word lines of the second up block 71. If both of the first active control signal BACT_CNT1 and the second active control signal BACT_CNT2 are enabled to have a logic "high" level, the count control signal CNTP may be enabled to count the first row address RA1<1:N> and both of the first active control signal BACT_CNT1 and the second active control signal BACT_CNT2 may be disabled to have a logic "low" level.

Figure 10:
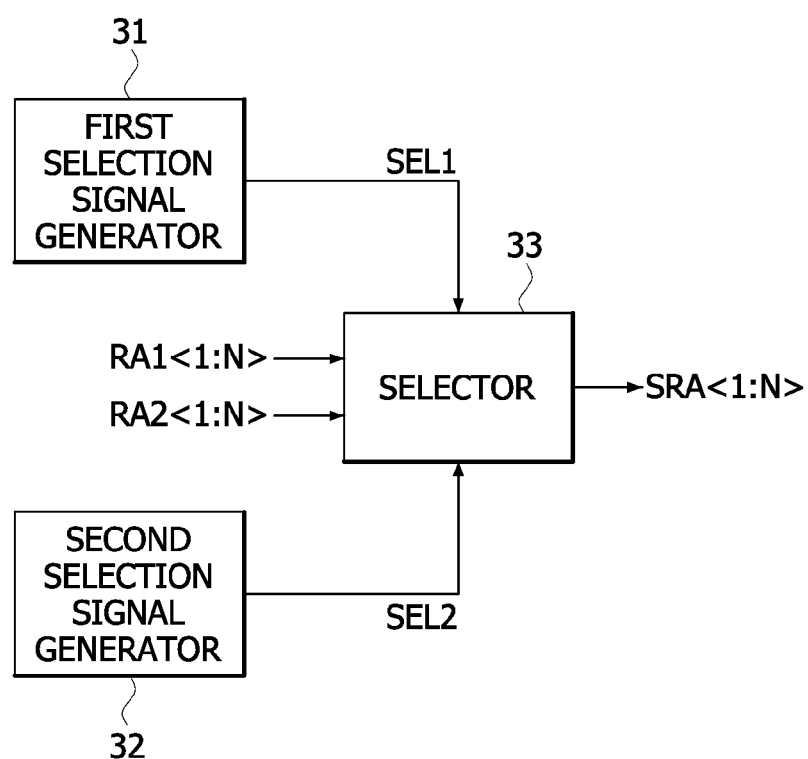
FIG. 10 is a block diagram illustrating an example of an address selection circuit included in the semiconductor device of FIG. 2.

Referring to FIG. 10, the address selection circuit 3 may include a first selection signal generator 31, a second selection signal generator 32 and a selector 33.

The first selection signal generator 31 may generate a first selection signal SEL1 which is enabled if the first row address RA1<1:N> is generated to refresh the memory cells included in the first and second up blocks 61 and 71. The first selection signal generator 31 may generate the first selection signal SEL1 which is enabled if the first row address RA1<1:N> is generated in response to the refresh commands PBR_CMD<1:2> and the bank active signals BACT<1:2>.

The second selection signal generator 32 may generate a second selection signal SEL2 which is enabled if the second row address RA2<1:N> is generated to refresh the memory cells included in the first and second down blocks 62 and 72. The second selection signal generator 32 may generate the second selection signal SEL2 which is enabled if the second row address RA2<1:N> is generated in response to the refresh commands PBR_CMD<1:2> and the bank active signals BACT<1:2>.

The selector 33 may generate the refresh address SRA<1:N> from the first row address RA1<1:N> and the second row address RA2<1:N> in response to the first and second selection signals SEL1 and SEL2. The selector 33 may output the first row address RA1<1:N> as the refresh address SRA<1:N> if the first selection signal SEL1 is enabled. The selector 33 may output the second row address RA2<1:N> as the refresh address SRA<1:N> if the second selection signal SEL2 is enabled.

Figure 11:
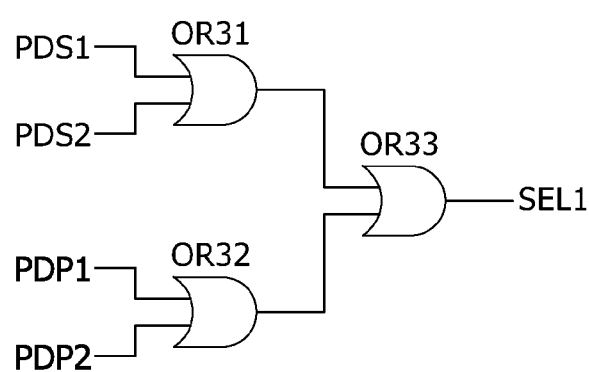
FIG. 11 is a circuit diagram illustrating an example of a first selection signal generator included in the address selection circuit of FIG. 10.

Referring to FIG. 11, the first selection signal generator 31 may include logic OR gates OR31, OR32 and OR33. The first selection signal generator 31 may generate the first selection signal SEL1 which is enabled to have a logic "high" level if at least one of the first pull-down signal PDS1, the second pull-down signal PDS2, the first pull-down pulse PDP1 and the second pull-down pulse PDP2 is enabled to have a logic "high" level. The first pull-down signal PDS1 may be enabled to a logic "high" level to refresh the memory cells included in the first up block 61 using the refresh command PBR_CMD<1>. The second pull-down signal PDS2 may be enabled to a logic "high" level to refresh the memory cells included in the second up block 71 using the refresh command PBR_CMD<2>. The first pull-down signal PDS1 may be enabled to a logic "high" level to refresh the memory cells included in the first up block 61 using the bank active signal BACT<1>. The second pull-down pulse PDP2 may be enabled to a logic "high" level to refresh the memory cells included in the second up block 71 using the bank active signal BACT<2>.

Figure 12:
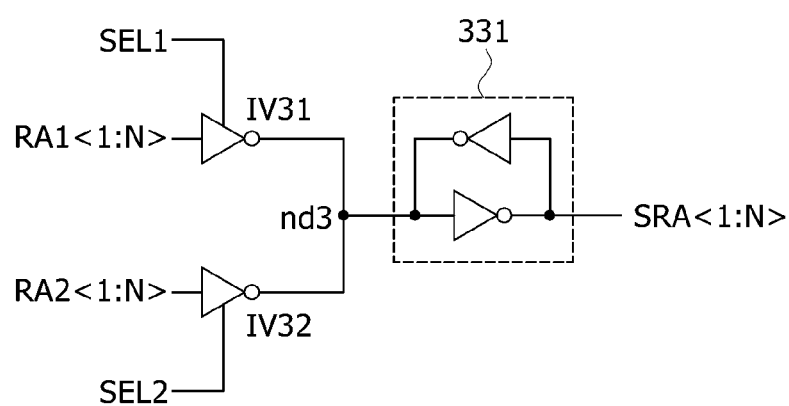
FIG. 12 is a circuit diagram illustrating an example of a selector included in the address selection circuit of FIG. 10.

Referring to FIG. 12, the selector 33 may include inverters IV31 and IV32 and output latch 331. The inverter IV31 may inversely buffer the first row address RA1<1:N> to output the inversely buffered address of the first row address RA1<1:N> to a node nd3, if the first selection signal SEL1 has a logic "high" level. The inverter IV32 may inversely buffer the second row address RA2<1:N> to output the inversely buffered address of the second row address RA2<1:N> to the node nd3, if the second selection signal SEL1 has a logic "high" level. The output latch 331 may latch a signal of the node nd3 and may inversely buffer the signal of the node nd3 to output the inversely buffered signal as the refresh address SRA<1:N>.

Figure 13:
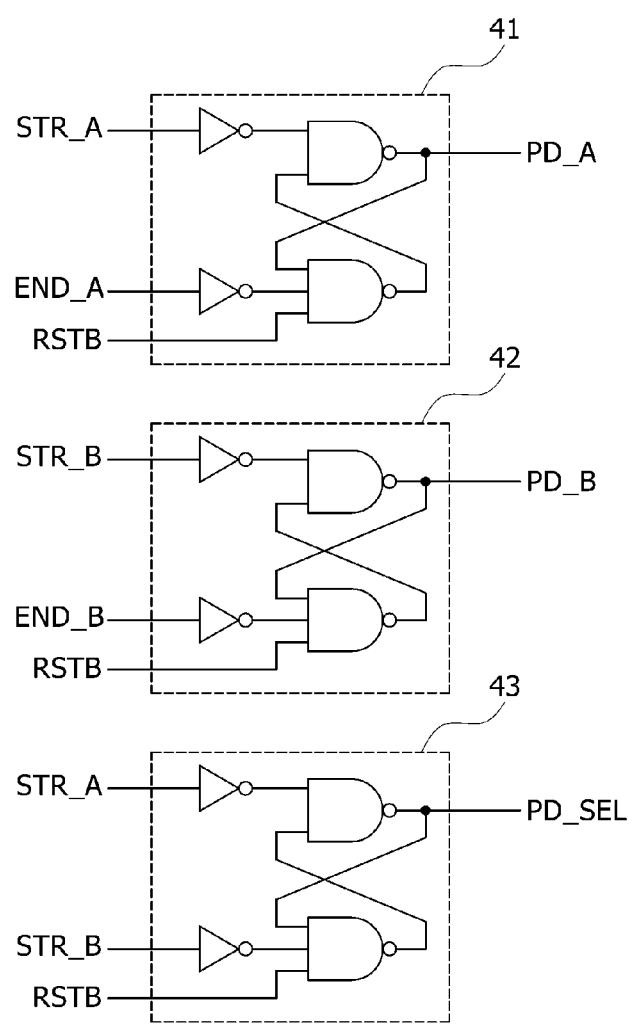
FIG. 13 is a circuit diagram illustrating an example of a period signal generation circuit included in the semiconductor device of FIG. 2.

Referring to FIG. 13, the period signal generation circuit 4 may include a first period signal generation circuit 41, a second period signal generation circuit 42 and a period selection signal generation circuit 43.

The first period signal generation circuit 41 may generate the first period signal PD_A in response to the first start signal STR_A and the first end signal END_A. The first period signal generation circuit 41 may generate the first period signal PD_A which is enabled to have a logic "high" level during a period from a point of time that the first start signal STR_A is enabled to have a logic "high" level until a point of time that the first end signal END_A is enabled to have a logic "high" level. The first start signal STR_A may be enabled to have a logic "high" level if the first row address RA1<1:N> has a logic level combination corresponding to the last word line included in the first and second up blocks 61 and 71. The first end signal END_A may be enabled to have a logic "high" level if the first row address RA1<1:N> has a logic level combination corresponding to the second last word line included in the first and second up blocks 61 and 71. The first period signal PD_A may be enabled to have a logic "high" level to refresh the first and second up blocks 61 and 71 using the bank active signals BACT<1:2>. The first period signal PD_A may be initialized by a reset signal RSTB to have a logic "low" level.

The second period signal generation circuit 42 may generate the second period signal PD_B in response to the second start signal STR_B and the second end signal END_B. The second period signal generation circuit 42 may generate the second period signal PD_B which is enabled to have a logic "high" level during a period from a point of time that the second start signal STR_B is enabled to have a logic "high" level until a point of time that the second end signal END_B is enabled to have a logic "high" level. The second start signal STR_B may be enabled to have a logic "high" level if the second row address RA2<1:N> has a logic level combination corresponding to the last word line included in the first and second down blocks 62 and 72. The second end signal END_B may be enabled to have a logic "high" level if the second row address RA2<1:N> has a logic level combination corresponding to the second last word line included in the first and second down blocks 62 and 72. The second period signal PD_B may be enabled to have a logic "high" level to refresh the first and second down blocks 62 and 72 using the bank active signals BACT<1:2>. The second period signal PD_B may be initialized by the reset signal RSTB to have a logic "low" level.

The period selection signal generation circuit 43 may generate the period selection signal PD_SEL in response to the first start signal STR_A and the second start signal STR_B. The period selection signal generation circuit 43 may generate the period selection signal PD_SEL having a logic "high" level in synchronization with a point of time that the first start signal STR_A is enabled to have a logic "high" level. The period selection signal generation circuit 43 may generate the period selection signal PD_SEL having a logic "low" level in synchronization with a point of time that the second start signal STR_B is enabled to have a logic "high" level. If the period selection signal PD_SEL has a logic "low" level, the first and second up blocks 61 and 71 may be refreshed by the refresh commands PBR_CMD<1:2>. If the period selection signal PD_SEL has a logic "high" level, the first and second down blocks 62 and 72 may be refreshed by the refresh commands PBR_CMD<1:2>.

Figure 14:
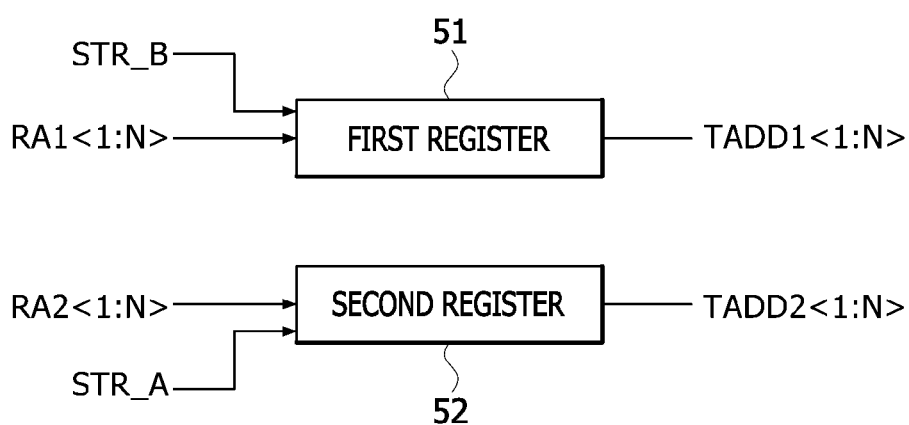
FIG. 14 is a block diagram illustrating an example of an address transmission circuit included in the semiconductor device of FIG. 2.

Referring to FIG. 14, the address transmission circuit 5 may include a first register 51 and a second register 52.

The first register 51 may output the first row address RA1<1:N> as the first transmission address TADD1<1:N> in response to the second start signal STR_B. The first register 51 may output the first row address RA1<1:N> as the first transmission address TADD1<1:N> in synchronization with a point of time that the second start signal STR_B is enabled.

The second register 52 may output the second row address RA2<1:N> as the second transmission address TADD2<1:N> in response to the first start signal STR_A. The second register 52 may output the second row address RA2<1:N> as the second transmission address TADD2<1:N> in synchronization with a point of time that the first start signal STR_A is enabled.

Figure 15:
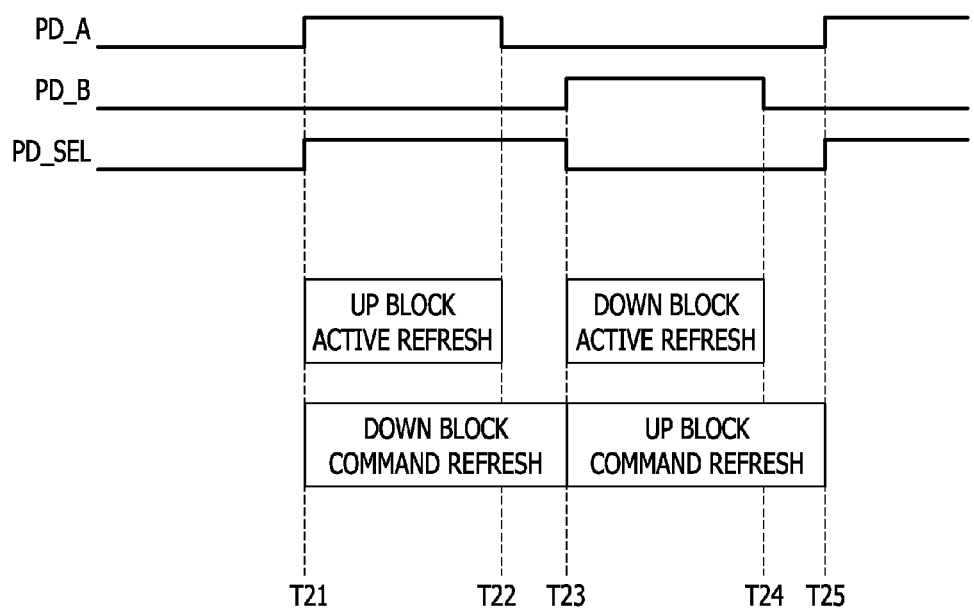
FIG. 15 is a timing diagram illustrating a refresh operation of the semiconductor device shown in FIG. 2.

A refresh operation of the semiconductor device will be described more fully with reference to FIG. 15.

In a period (from a point of time "T21" until a point of time "T22") that the first period signal PD_A has a logic "high" level, the word lines included in the first and second up blocks 61 and 71 may be activated by the first row address RA1<1:N> generated according to the bank active signals BACT<1:2> and memory cells connected to the activated word lines may be refreshed. If the first and second up blocks 61 and 71 include "8K"-number of word lines, the first to $(8K-1)^{th}$ word lines disposed in the first and second up blocks 61 and 71 may be sequentially activated during the period (from the point of time "T21" until the point of time "T22") that the first period signal PD_A has a logic "high" level and the memory cells connected to the activated word line may be refreshed.

In a period (from the point of time "T21" until a point of time "T23") that the period selection signal PD_SEL has a logic "high" level, the word lines included in the first and second down blocks 62 and 72 may be activated by the second row address RA2<1:N> generated according to the refresh commands PBR_CMD<1:2> and memory cells connected to the activated word lines may be refreshed. If the first and second down blocks 62 and 72 include "8K"-number of word lines, memory cells connected to the $8K^{th}$ word line included in the first and second down blocks 62 and 72 may be refreshed at the point of time "T23" to count the second row address RA2<1:N> so that a level of the second period signal PD_B is changed into a logic "high" level.

In a period (from the point of time "T23" until a point of time "T24") that the second period signal PD_B has a logic "high" level, the word lines included in the first and second down blocks 62 and may be activated by the second row address RA2<1:N> generated according to the bank active signals BACT<1:2> and memory cells connected to the activated word lines may be refreshed. If the first and second down blocks 62 and 72 include "8K"-number of word lines, the first to $(8K-1)^{th}$ word lines disposed in the first and second down blocks 62 and 72 may be sequentially activated during the period (from the point of time "T23" until the point of time "T24") that the second period signal PD_B has a logic "high" level and the memory cells connected to the activated word line may be refreshed.

In a period (from the point of time "T23" until a point of time "T25") that the period selection signal PD_SEL has a logic "low" level, the word lines included in the first and second up blocks 61 and 71 may be activated by the first row address RA1<1:N> generated according to the refresh commands PBR_CMD<1:2> and memory cells connected to the activated word lines may be refreshed. If the first and second up blocks 61 and 71 include "8K"-number of word lines, memory cells connected to the $8K^{th}$ word line included in the first and second up blocks 61 and 71 may be refreshed at the point of time "T25" to count the first row address RA1<1:N> so that a level of the first period signal PD_A is changed into a logic "high" level.

As described above, the semiconductor device according to an embodiment may divide the first bank 6 into the first up block 61 and the first down block 62, may divide the second bank 7 into the second up block 71 and the second down block 72, and may improve a refresh speed by simultaneously refreshing the first and second up blocks 61 and 71 and by simultaneously refreshing the first and second down blocks 62 and 72. The semiconductor device may refresh memory cells connected to the word lines included in the first and second up blocks 61 and 71 according to the bank active signals BACT<1:2> and may refresh memory cells connected to the word lines included in the first and second down blocks 62 and 72 according to the refresh commands PBR_CMD<1:2>. In addition, the semiconductor device may refresh memory cells connected to the word lines included in the first and second down blocks 62 and 72 according to the bank active signals BACT<1:2> and may refresh memory cells connected to the word lines included in the first and second up blocks 61 and 71 according to the refresh commands PBR_CMD<1:2>. As a result, the number of the memory cells refreshed according to the refresh commands PBR_CMD<1:2> may be reduced.

Figure 16:
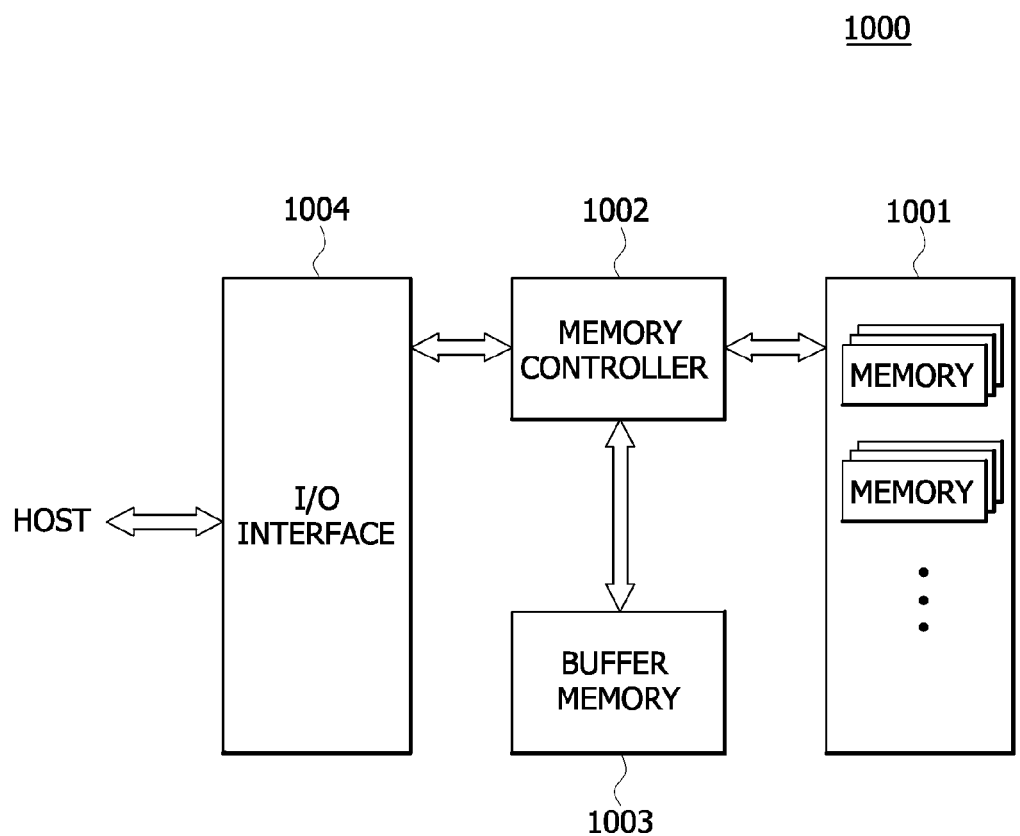
FIG. 16 is a block diagram illustrating a configuration of an example of an electronic system employing the semiconductor device shown in FIG. 2.

The semiconductor device described with reference to FIGS. 1 to 15 may be applied to an electronic system that includes a memory system, a graphic system, a computing system, a mobile system, or the like. For example, as illustrated in FIG. 16, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the core region illustrated in FIG. 1 and the semiconductor device illustrated in FIG. 2. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 16 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

According to the above embodiment, each of memory banks may be divided into a plurality of blocks and blocks selected from the respective memory banks may be simultaneously refreshed to improve a refresh speed.

In addition, a refresh period may be divided into a period in which a refresh operation is performed by bank active signals and a period in which the refresh operation is performed by refresh commands, thereby reducing the period in which the refresh operation is performed by refresh commands.

Moreover, while a refresh operation is performed by the bank active signals, the bank active signals may not be inputted to the same memory bank to reduce power consumption.

While certain embodiments have been described above, it will be understood by those skilled in the art that the embodiments described are by way of example only. Accordingly, the refresh features described herein should not be limited based on the described embodiments. Rather, the refresh features described herein should only be limited in light of the claims that follow, when taken in conjunction with the above description and accompanying drawings.

What is claimed is:

1. A semiconductor device comprising:
   a first row address generation circuit configured to generate a first row address for refreshing memory cells connected to first group word lines included in a first up block and a second up block from a refresh command and an active signal in response to a period selection signal and a first period signal;
   a second row address generation circuit configured to generate a second row address for refreshing memory cells connected to second group word lines included in a first down block and a second down block from the refresh command and the active signal in response to the period selection signal and a second period signal; and
   a period signal generation circuit configured to generate the first period signal, the second period signal and the period selection signal in response to a first start signal, a first end signal, a second start signal and a second end signal.

2. The semiconductor device of claim 1,
   wherein the first up block and the first down block are included in a first bank; and wherein the second up block and the second down block are included in a second bank.

3. The semiconductor device of claim 1,
wherein the period selection signal has a first logic level to generate the first row address from the refresh command; and
wherein the period selection signal has a second logic level to generate the second row address from the refresh command.

4. The semiconductor device of claim 1, wherein the first period signal is enabled during a period from a point of time that the first row address for activating a first word line included in the first group word lines is generated till a point of time that the first row address for activating an $N^{th}$ word line included in the first group word lines is generated.

5. The semiconductor device of claim 1, wherein the first row address generation circuit is configured to generate the first row address from the active signal during a period that the first period signal is enabled.

6. The semiconductor device of claim 1, wherein the second row address generation circuit is configured to generate the second row address from the active signal during a period that the second period signal is enabled.

7. The semiconductor device of claim 1, further comprising an address selection circuit configured to output the first row address or the second row address as a refresh address.

8. The semiconductor device of claim 1,
wherein the first row address generation circuit is configured to generate the first start signal which is enabled if the first row address for activating a first word line included in the first group word lines is generated; and
wherein the first row address generation circuit is configured to generate the first end signal which is enabled if the first row address for activating an $N^{th}$ word line included in the first group word lines is generated.

9. The semiconductor device of claim 1,
wherein the second row address generation circuit is configured to generate a second start signal which is enabled if the second row address for activating a first word line included in the second group word lines is generated; and
wherein the second row address generation circuit is configured to generate a second end signal which is enabled if the second row address for activating an $N^{th}$ word line included in the second group word lines is generated.

10. The semiconductor device of claim 1,
wherein the first period signal is enabled during a period from a point of time that the first start signal is enabled till a point of time that the first end signal is enabled;
wherein the second period signal is enabled during a period from a point of time that the second start signal is enabled till a point of time that the second end signal is enabled; and
wherein the period selection signal is enabled during a period from a point of time that the first start signal is enabled till a point of time that the second start signal is enabled.

11. The semiconductor device of claim 1, further comprising an address transmission circuit configured to output the first row address and the second row address as a first transmission address and a second transmission address in response to the first start signal and the second start signal.

12. The semiconductor device of claim 11, wherein the first and second transmission addresses are used to apply the refresh command to the first and second row address generation circuits.

13. The semiconductor device of claim 1, wherein the first row address generation circuit includes:
a command control signal generation circuit configured to generate a command control signal from the refresh command in response to the period selection signal;
an active control signal generation circuit configured to generate an active control signal from the active signal in response to the first period signal;
a count control signal generation circuit configured to generate a count control signal for counting the first row address in response to the command control signal and the active control signal.

14. The semiconductor device of claim 13, wherein the command control signal generation circuit includes:
a pull-down signal generation circuit configured to buffer the refresh command to generate a pull-down signal in response to the period selection signal; and
a command control signal driving circuit configured to drive the command control signal in response to a reset signal and the pull-down signal.

15. The semiconductor device of claim 13, wherein the active control signal generation circuit is configured to block input of the active signal if the active control signal is enabled.

16. The semiconductor device of claim 13, wherein the active control signal generation circuit includes:
a pulse generation circuit configured to generate a pulse which is created if both of the first period signal and the active signal are enabled;
a pull-down pulse generation circuit configured to generate a pull-down pulse in response to the pulse; and
an active control signal driving circuit configured to drive the active control signal in response to a reset signal and the pull-down pulse.

17. The semiconductor device of claim 16, wherein generation of the pull-down pulse terminates if the active control signal is enabled.

18. The semiconductor device of claim 13, wherein the first row address generation circuit further includes a counter configured to output the first row address that is counted in response to the count control signal.

19. The semiconductor device of claim 13, wherein the first row address generation circuit further includes an address sensing circuit configured to sense the first row address to generate the first start signal which is enabled to activate a first word line included in the first and second up blocks and to generate the first end signal which is enabled to activate an $N^{th}$ word line included in the first and second up blocks.

20. A semiconductor device comprising:
a row address generation circuit configured to generate a row address for refreshing memory cells connected to group word lines included in a first block and a second block from a refresh command and an active signal in response to a period selection signal and a period signal; and
a period signal generation circuit configured to generate the period signal and the period selection signal in response to a start signal and an end signal,
wherein the row address generation circuit includes:
a command control signal generation circuit configured to generate a command control signal from the refresh command in response to the period selection signal;
an active control signal generation circuit configured to generate an active control signal from the active signal in response to the period signal; and a count control signal generation circuit configured to generate a count control signal for counting the row address in response to the command control signal and the active control signal.

21. The semiconductor device of claim 20,
wherein the row address has a logic level combination for activating the group word lines included in the first block and the second block; and
wherein the first block is included in the first bank and the second block is included in the second bank.

22. The semiconductor device of claim 20, wherein the command control signal generation circuit includes:
a pull-down signal generation circuit configured to buffer the refresh command to generate a pull-down signal in response to the period selection signal; and
a command control signal driving circuit configured to drive the command control signal in response to a reset signal and the pull-down signal.

23. The semiconductor device of claim 20, wherein the active control signal generation circuit is configured to block input of the active signal if the active control signal is enabled.

24. The semiconductor device of claim 20, wherein the active control signal generation circuit includes:
a pulse generation circuit configured to generate a pulse which is created if both of the period signal and the active signal are enabled;
a pull-down pulse generation circuit configured to generate a pull-down pulse in response to the pulse; and
an active control signal driving circuit configured to drive the active control signal in response to a reset signal and the pull-down pulse.

25. The semiconductor device of claim 24, wherein generation of the pull-down pulse terminates if the active control signal is enabled.

26. The semiconductor device of claim 20, wherein the row address generation circuit further includes a counter configured to output the row address that is counted in response to the count control signal.

27. The semiconductor device of claim 20, wherein the row address generation circuit further includes an address sensing circuit configured to sense the row address to generate the start signal which is enabled to activate a first word line included in the group word lines and to generate the end signal which is enabled to activate an $N^{th}$ word line included in the group word lines.

\* \* \* \* \*